United States Patent
Kim

(10) Patent No.: US 7,534,703 B2
(45) Date of Patent: May 19, 2009

(54) METHOD FOR BONDING SEMICONDUCTOR CHIP

(75) Inventor: Sung Chul Kim, Seoul (KR)

(73) Assignee: Sigo Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/764,860

(22) Filed: Jun. 19, 2007

(65) Prior Publication Data
US 2007/0298539 A1    Dec. 27, 2007

(30) Foreign Application Priority Data
Jun. 23, 2006    (KR) .................. 10-2006-0056815

(51) Int. Cl.
*H01L 21/78* (2006.01)

(52) U.S. Cl. .............. 438/464; 438/113; 438/460; 438/E21.238; 438/E21.599

(58) Field of Classification Search ......... 438/106–110, 438/113–114, 460–464, 33, 68
See application file for complete search history.

(56) References Cited

U.S. PATENT DOCUMENTS

| | | | |
|---|---|---|---|
| 5,888,883 A * | 3/1999 | Sasaki et al. ............... 438/460 |
| 6,337,258 B1 * | 1/2002 | Nakayoshi et al. .......... 438/464 |
| 2007/0296445 A1 * | 12/2007 | Kim ........................... 324/765 |

* cited by examiner

*Primary Examiner*—Dung A. Le
(74) *Attorney, Agent, or Firm*—Sughrue Mion, PLLC

(57) ABSTRACT

A method for bonding a semiconductor chip is disclosed. In accordance with the method of the present invention, a front surface of a wafer is mounted in a wafer holder to face downward. Each of dies of the wafer is then pushed downward to a tray disposed therebelow, thereby eliminating a need for a separate flipping process of the semiconductor chip and two or more robot arms.

10 Claims, 2 Drawing Sheets

METHOD FOR BONDING SEMICONDUCTOR CHIP

This is a non-provisional application under 35 U.S.C. § 1.111(a) which claims priority from Korean patent application 10-2006-0056815 filed Jun. 23, 2006, which is incorporated herein by reference.

BACKGROUND OF THE INVENTION

1. Field of the Invention

The present invention relates to a method for bonding a semiconductor chip, and in particular to a method for bonding a semiconductor chip wherein a separate flipping process is not required by mounting a wafer in a manner the a front surface of the wafer is faces downwards and then pushed a die downward to a tray therebelow.

2. Description of the Related Art

A plurality of semiconductor chips are formed on a wafer. Each of the plurality of semiconductor chips includes a connection pad for connecting to an external terminal. Generally, an integrated circuit (IC) has a structure wherein a plurality of wires are bonded to the pad to be contacted to a lead outside a packaging thereof.

On the other hand, a flip chip includes a bump for a connection to an external connector. The flip chip is flipped in a manner that a surface having the bump faces downward and then press-bonded or heat-bonded to a bonding terminal of an object to be bonded such as a flexible film.

A conventional flip chip bonding method is described below in detail.

FIG. 1 is a flow diagram depicting a conventional flip chip bonding method.

Referring to FIG. 1, a semiconductor wafer is sawed to be divided into a plurality of semiconductor chips and mounted in a wafer holder (S10). A first robot arm having a vacuum suction picks up one of the plurality of semiconductor chips (S20). The picked-up semiconductor chip is flipped by a rotation of the first robot arm (S30). A lower surface of each of the flipped semiconductor chips wherein electrical elements are not formed, i.e. a back surface thereof faces upward. The flipped semiconductor chips are sequentially picked up (S40) by a second robot arm to be disposed on and aligned to an object to be bonded (S50). A front surface of the disposed semiconductor chip faces downward, and a bump formed on the semiconductor chip and a connection area of the object to be bonded are in contact. The disposed semiconductor chip is heated and pressed for bonding (S60).

In accordance with the conventional flip chip bonding method, two processes including a flipping process and a pick & place process of the flipped chip are required. That is, the flipping process wherein the semiconductor chip is picked from the wafer and flipped by the first robot arm and the pick & place process wherein the flipped chip is picked up by the second robot arm to be disposed on the object to be bonded.

Since the two processes are carried out by the robot arms, a time taken while moving of the robot arm is relatively long. In addition, a cost for installing the two robot arms is high, and a complexity of a bonding apparatus is increased. Particularly, a production per hour is decreased as the time taken while moving of the robot arm is increased. That is, a productivity is decreased due to the robot arm. The productivity is an index for measuring a competitiveness of a manufacturing company as well as having a great effect on a manufacturing cost of a product, which is a most important factor of a survival of the manufacturing company.

Therefore, various methods for increasing the productivity are proposed. However, due to a characteristic of the flip chip wherein the semiconductor chip should be flipped, a method that overcomes the above-described problem is not available.

SUMMARY OF THE INVENTION

It is an object of the present invention to provide a method for bonding a semiconductor chip wherein a separate flipping process is not required since a front surface of a wafer is mounted to face downward and a die is then pushed downward to a tray therebelow.

In order to achieve above-described object of the present invention, there is provided a semiconductor chip bonding method comprising steps of: (a) preparing a wafer having a plurality of semiconductor chips disposed on a front surface thereof (b) disposing the wafer on a wafer holder in a manner that the front surface of the wafer faces downward; (c) pushing each of the plurality of semiconductor chips downward to be disposed on a tray having a plurality of semiconductor chip guides; (d) sequentially picking up each of the plurality of semiconductor chips from the tray and disposing the picked up semiconductor chip on an object to be bonded; and (e) bonding the plurality of semiconductor chips to the object to be bonded.

Preferably, the step (a) comprises dicing the wafer along a scribe lane on the wafer.

Preferably, the step (c) comprises conveying the tray according to an arrangement gap of an object to be bonded to adjust a distance between the plurality of semiconductor chips disposed in the tray.

Preferably, the step (e) comprises: pressure-bonding each of the plurality of semiconductor chips to the object to be bonded; and heat-bonding each of the plurality of semiconductor chips to the object to be bonded.

Preferably, the object to be bonded comprises an antennal of an RFID tag.

Preferably, the semiconductor chip bonding method further comprises forming a protective layer protecting a bonding region of the semiconductor chip and the object to be bonded.

Preferably, the semiconductor chip bonding method further comprises curing the protective layer by radiating an ultraviolet ray.

Preferably, the protective layer comprises an epoxy resin.

Preferably, the semiconductor chip bonding method further comprises providing the object to be bonded through a magazine having plurality of the objects continuously loaded therein.

Preferably, the step (c) comprises disposing the semiconductor chip pushed downward in the semiconductor chip guide of the tray by a vacuum suction.

DETAILED DESCRIPTION OF THE INVENTION

The present invention will now be described in detail with reference to the accompanied drawings. The interpretations of the terms and wordings used in Description and Claims should not be limited to common or literal meanings. The embodiments of the present invention are provided to describe the present invention more thoroughly for those skilled in the art.

Figure 1:
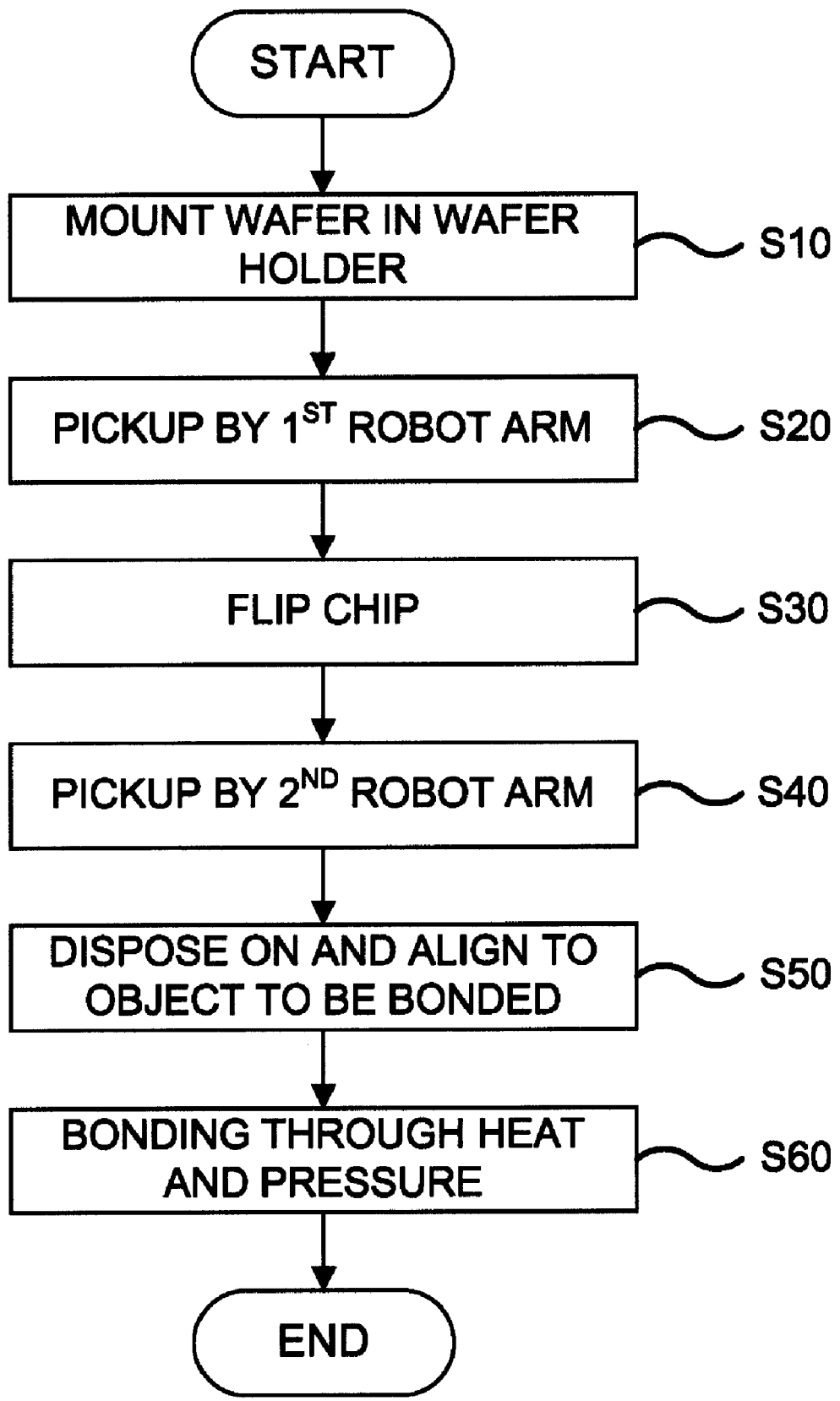
FIG. 1 is a flow diagram depicting a conventional flip chip bonding method.
Figure 2:
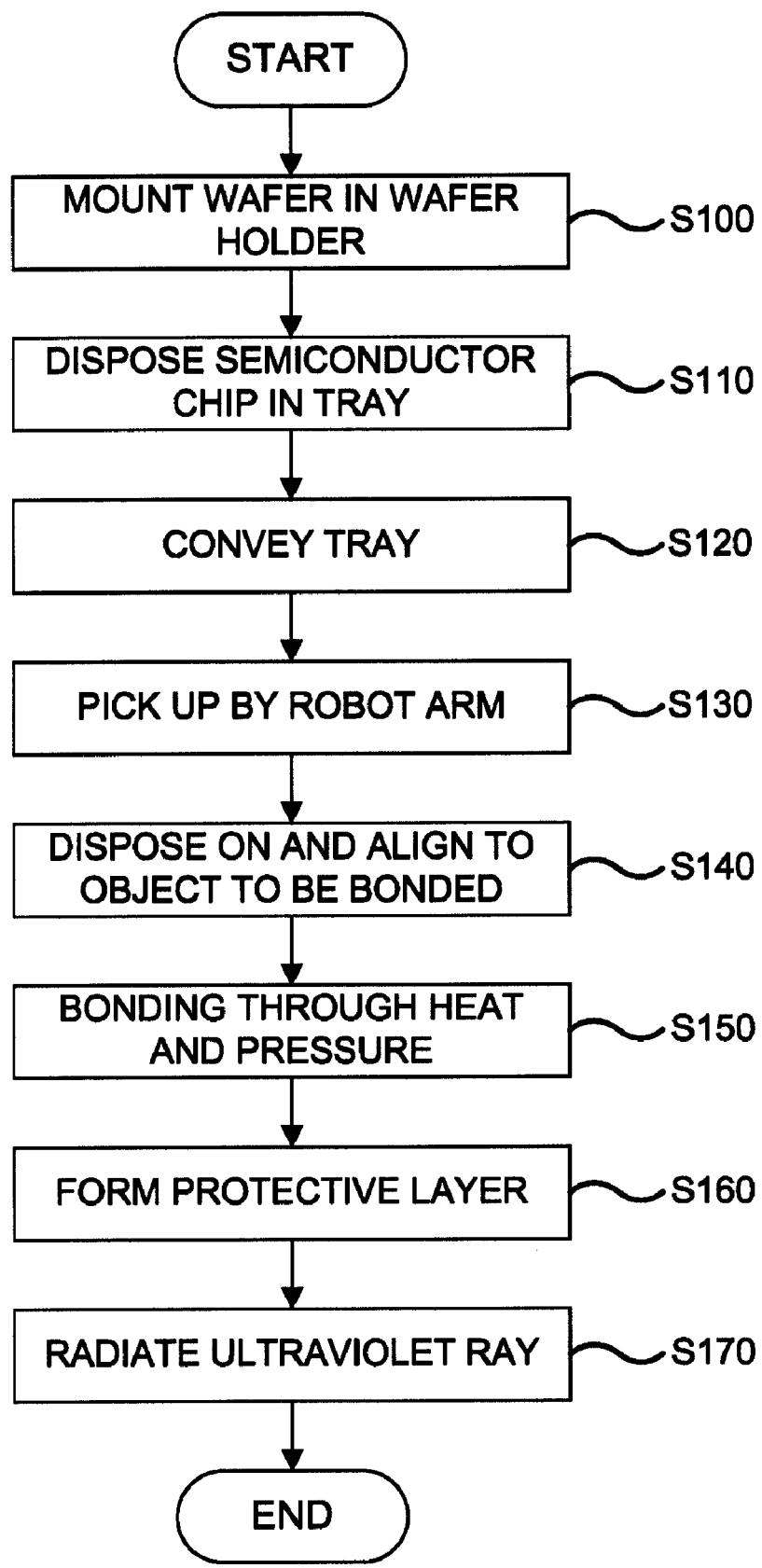
FIG. 2 is a flow diagram depicting a semiconductor chip bonding method in accordance with the present invention.

FIG. 2 is a flow diagram depicting a semiconductor chip bonding method in accordance with the present invention.

Referring to FIG. 2, a wafer having a plurality of semiconductor chips disposed on a front surface thereof is prepared (S100).

The wafer includes the plurality of semiconductor chips diced along a scribe lane on the wafer by a semiconductor chip unit. A surface on which the plurality of semiconductor chips are formed is hereinafter referred to as a front surface and a surface opposite to the front surface is hereinafter referred to as a back surface.

Thereafter, the wafer is disposed on a wafer holder in a manner that the front surface of the wafer faces downward (S110).

Thereafter, each of the plurality of semiconductor chips is pushed downward by a pusher (not shown) to be disposed on a tray therebelow. The tray includes a plurality of semiconductor chip guides having a predetermined distance therebetween. The tray may be moved in order to dispose the semiconductor chip in a certain semiconductor chip guide. The tray may be conveyed in a predetermined direction for a pick & place when the disposition of the plurality of semiconductor chips is complete.

The tray may be moved in order to adjust a distance between the plurality of semiconductor chips disposed in the tray. For instance, a distance between the objects to be bonded (an arrangement gap) varies according to a size of each of the objects when the object is an antenna of an RFID tag that fed through a magazine or a roll having the objects continuously loaded therein. That is, a number of the objects included a unit length is small when the size of the object is large, and the number of the objects included the unit length is large when the size of the object is small. The distance between the plurality of semiconductor chips disposed in the tray may be adjusted. For instance, when a length of the object is 1, the semiconductor chips are disposed in an entirety of the plurality of semiconductor chip guides. When the length of the object is 2, the semiconductor chips are disposed in every two of the plurality of semiconductor chip guides. Through such adjustment, the semiconductor chip may correspond to the object to be bonded by a ratio of 1:1. Preferably, the semiconductor chip pushed downward is guided to the tray by a vacuum suction disposed therebelow in order to guide the semiconductor chip in a desired semiconductor chip guide.

The semiconductor chips disposed in the tray are already flipped, that is, a surface of the semiconductor chip having a contact pad is facing downward.

Thereafter, the tray is conveyed to a proper position for the pick & place (S130). The plurality of semiconductor chips are sequentially picked up by a robot arm (not shown) (S140) to be disposed on and aligned to the object to be bonded (S150).

Thereafter, the semiconductor chip is bonded to the object to be bonded. The bonding process may comprise a pressure-bonding each of the plurality of semiconductor chips to the object to be bonded and a heat-bonding each of the plurality of semiconductor chips to the object to be bonded (S160).

When the bonding process is complete, a test may be carried out by applying a predetermined signal to determine whether the bonding process is carried out properly and the semiconductor chip operates correctly.

When the bonding process is carried out properly and the semiconductor chip operates correctly according to a result of the test, a protective layer may be formed to protect a bonding region of the semiconductor chip and the object to be bonded (S170). It is preferable that the protective layer comprises an epoxy resin.

Thereafter, the protective layer may be cured by radiating an ultraviolet ray (S170).

As described above, in accordance with the method of the present invention, a separate chip flipping process is not required since the die is pushed downward to be disposed in the tray after the front surface of the wafer is mounted to face downward. In addition, a productivity is maximized and a manufacturing cost of the bonding apparatus may be minimized since the flip chip bonding may be carried out using only one robot arm.

What is claimed is:

1. A semiconductor chip bonding method comprising steps of:
    (a) preparing a wafer having a plurality of semiconductor chips disposed on a front surface thereof;
    (b) disposing the wafer on a wafer holder in a manner that the front surface of the wafer faces downward;
    (c) pushing each of the plurality of semiconductor chips downward to be disposed on a tray having a plurality of semiconductor chip guides;
    (d) sequentially picking up each of the plurality of semiconductor chips from the tray and disposing the picked up semiconductor chip on an object to be bonded; and
    (e) bonding the plurality of semiconductor chips to the object to be bonded.

2. The method in accordance with claim 1, wherein the step (a) comprises dicing the wafer along a scribe lane on the wafer.

3. The method in accordance with claim 1, wherein the step (c) comprises conveying the tray according to an arrangement gap of an object to be bonded to adjust a distance between the plurality of semiconductor chips disposed in the tray.

4. The method in accordance with claim 1, wherein the step (e) comprises:
    pressure-bonding each of the plurality of semiconductor chips to the object to be bonded; and
    heat-bonding each of the plurality of semiconductor chips to the object to be bonded.

5. The method in accordance with claim 1, wherein the object to be bonded comprises an antennal of an RFID tag.

6. The method in accordance with claim 1, further comprising forming a protective layer protecting a bonding region of the semiconductor chip and the object to be bonded.

7. The method in accordance with claim 6, further comprising curing the protective layer by radiating an ultraviolet ray.

8. The method in accordance with claim 6, wherein the protective layer comprises an epoxy resin.

9. The method in accordance with claim 1, further comprising providing the object to be bonded through a magazine having plurality of the objects continuously loaded therein.

10. The method in accordance with claim 1, wherein the step (c) comprises disposing the semiconductor chip pushed downward in the semiconductor chip guide of the tray by a vacuum suction.

* * * * *